United States Patent
Shibata et al.

(10) Patent No.: US 7,626,126 B2
(45) Date of Patent: Dec. 1, 2009

(54) MULTILAYER SEMICONDUCTOR DEVICE

(75) Inventors: Akiji Shibata, Hitachi (JP); Kimio Inaba, Hitachi (JP); Masayuki Hosono, Toyoshima-ku (JP)

(73) Assignee: Hitachi Cable, Ltd., Chiyoda-ku, Tokyo (JP)

( * ) Notice: Subject to any disclaimer, the term of this patent is extended or adjusted under 35 U.S.C. 154(b) by 74 days.

(21) Appl. No.: 11/447,975

(22) Filed: Jun. 7, 2006

(65) Prior Publication Data
US 2007/0151754 A1   Jul. 5, 2007

(30) Foreign Application Priority Data
Jan. 5, 2006   (JP)   ............... 2006-000682

(51) Int. Cl.
*H05K 1/16* (2006.01)
(52) U.S. Cl. ................. 174/260; 174/261
(58) Field of Classification Search ........... 174/260, 174/261; 257/778, 686
See application file for complete search history.

(56) References Cited

U.S. PATENT DOCUMENTS

| | | | | |
|---|---|---|---|---|
| 6,239,383 B1 * | 5/2001 | Lin | ............ | 174/260 |
| 6,400,033 B1 * | 6/2002 | Darveaux | ............ | 257/778 |
| 6,642,626 B2 * | 11/2003 | Park | ............ | 257/778 |
| 6,778,404 B1 * | 8/2004 | Bolken et al. | ............ | 361/767 |
| 2004/0036181 A1 * | 2/2004 | Hedler et al. | ............ | 257/779 |
| 2006/0247343 A1 * | 11/2006 | Kishimoto et al. | ............ | 524/117 |

FOREIGN PATENT DOCUMENTS

| | | |
|---|---|---|
| JP | 2002-76265 | 3/2002 |
| JP | 2003-133519 | 5/2003 |

\* cited by examiner

*Primary Examiner*—Ishwar (I. B.) Patel
(74) *Attorney, Agent, or Firm*—McGinn Intellectual Property Law Group, PLLC

(57) ABSTRACT

A multilayer semiconductor device has plural semiconductor devices, each having a circuit board for a ball grid array and a semiconductor chip provided on the board. The semiconductor boards are bonded together by a reflow mounting process to use a solder ball for interlayer connection so as to form a multilayer structure. The plural semiconductor devices each have a projection for restricting inclination of the circuit board, and the projection is provided between neighboring two of the circuit boards.

18 Claims, 7 Drawing Sheets

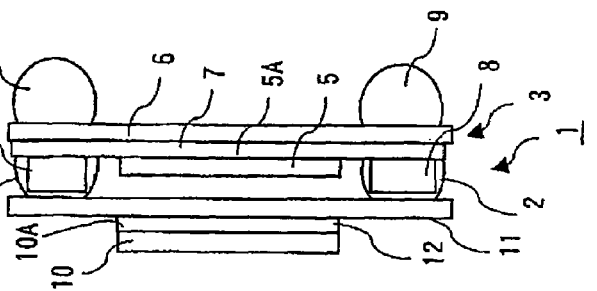
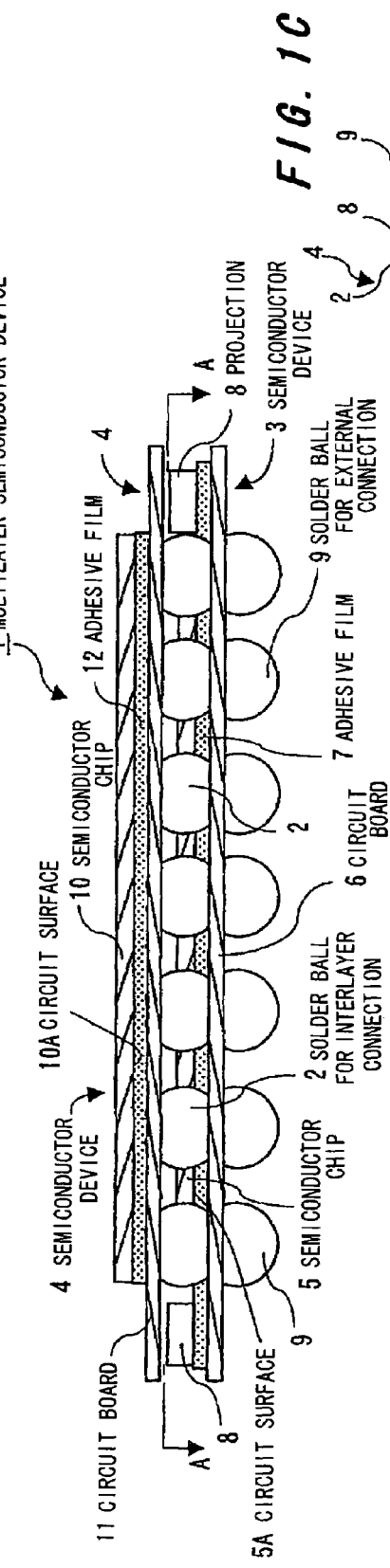
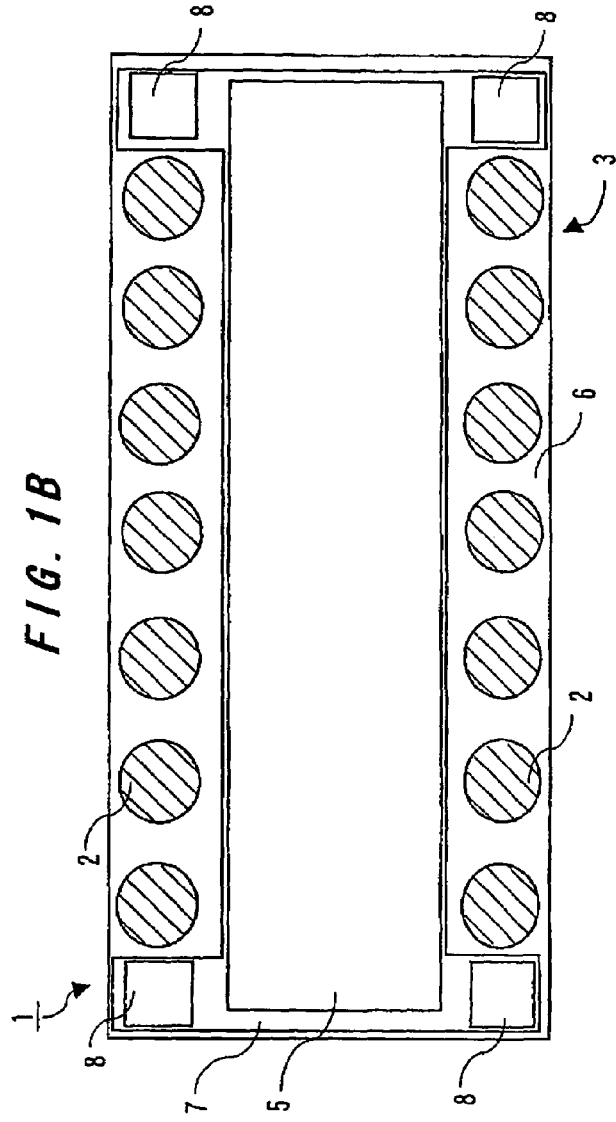

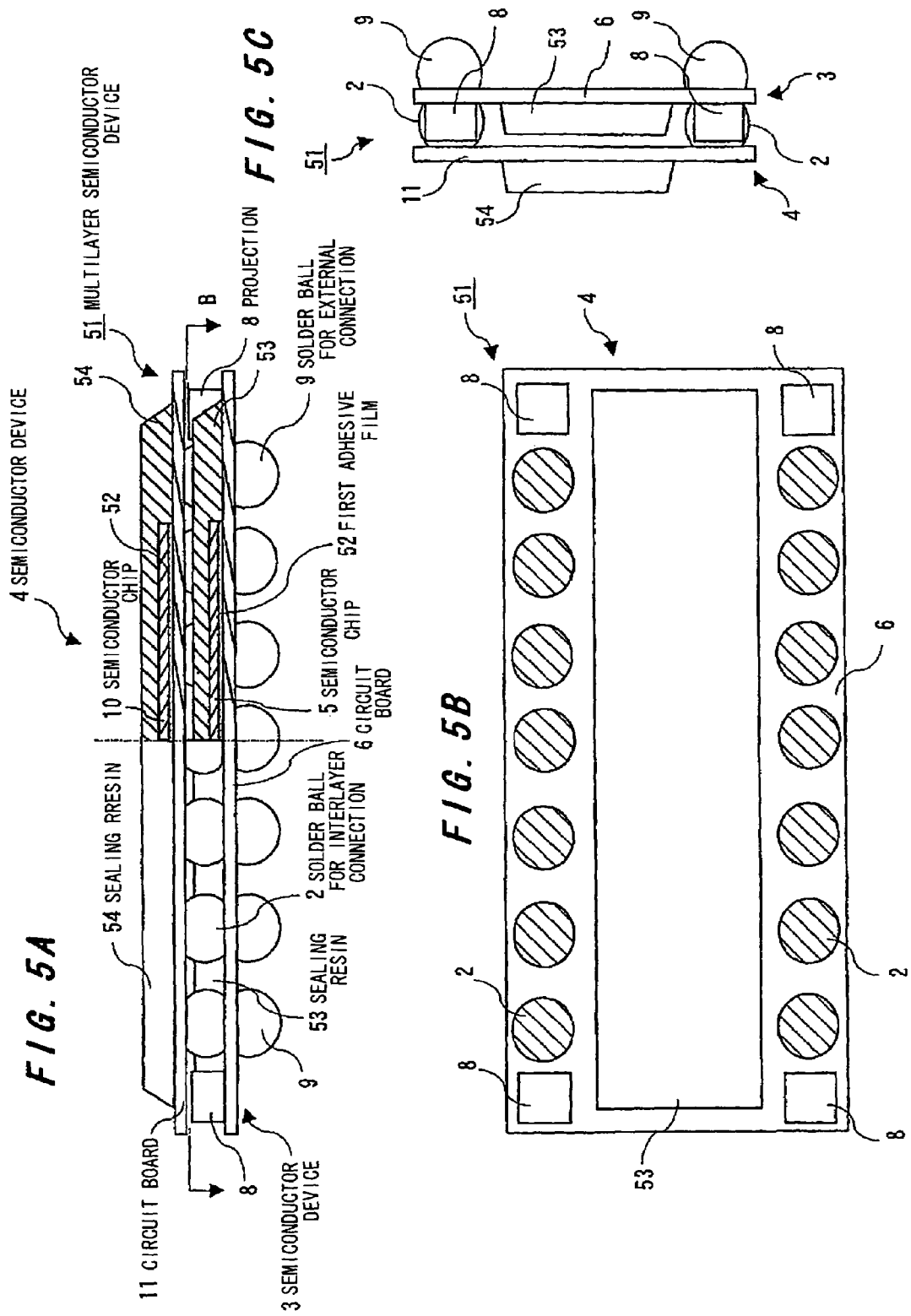

MULTILAYER SEMICONDUCTOR DEVICE

The present application is based on Japanese patent application No. 2006-000682, the entire contents of which are incorporated herein by reference.

BACKGROUND OF THE INVENTION

1. Field of the Invention

This invention relates to a multilayer semiconductor device and, in particular, to a multilayer semiconductor device that is suitably used as electronic parts composing an electronic device such as an IC card. Also, this invention relates to a method of manufacturing the multilayer semiconductor device.

2. Description of the Related Art

Generally, an electronic device operates with plural semiconductor parts (electronic parts) being mounted on one surface or both surfaces of a printed-wiring board. The plural semiconductor parts are each disposed usually in parallel lengthwise and crosswise on the surface of the printed-wiring board.

In recent years, a multilayer (or multilayer-type) semiconductor device is developed as the electronic device in order to respond to the high-density mounting of the parts. The multilayer semiconductor device comprises plural semiconductor chips or plural semiconductor devices being laminated together in a single semiconductor device (or semiconductor package).

The above-mentioned multilayer semiconductor device is manufactured such that semiconductor devices having a printed-wiring board for BGA (ball grid array) are each fabricated, and then the devices thus fabricated are laminated together on a circuit board (a motherboard) for mounting a semiconductor device.

A multilayer semiconductor device is known that comprises plural wiring boards with a semiconductor chip mounted thereon and sealed by a sealing resin, interlayer connecting terminals for connecting neighboring two of the wiring boards, and plural dummy bumps disposed mutually in parallel with a certain distance on the mounting side of the interlayer connecting terminal (e.g., JP-A-2003-133519).

Also, a multilayer semiconductor device is known that comprises plural intermediate boards with a semiconductor chip mounted thereon, interlayer connecting terminals for connecting neighboring two of the intermediate boards, and external connecting terminals made from a material softer than the interlayer connecting terminal (e.g., JP-A-2002-76265).

By the way, the above-mentioned conventional multilayer semiconductor devices are manufactured such that laminated semiconductor devices (BGA type semiconductor devices) to be bonded each other are conveyed into a reflow furnace heated to above a solder melting point by means of a conveyer and the like, and then the semiconductor devices with a solder ball melted in the reflow furnace are taken out from the reflow furnace to harden the solder ball.

However, the multilayer semiconductor device of JP-A-2003-133519 has the next problems.

The multilayer semiconductor device comprises the dummy bumps interposed between the neighboring two wiring boards. The dummy bump allows the bend of the semiconductor chips when a heat cycle test and a mechanical stress test are performed. However, the dummy bump does not have a function to restrict inclination of the semiconductor device (the wiring board). This may cause a problem as described below.

In the multilayer semiconductor device of JP-A-2003-133519, when a reflow mounting process is conducted with a solder ball faced downward, the stacking (upper) semiconductor device is connected by being soldered to a land preliminarily formed on the lower semiconductor device. When the reflow mounting process is conducted with the solder ball faced upward vice versa, the stacked (lower) semiconductor device is connected by being soldered to a land preliminarily formed on the upper semiconductor device.

In this case, when the semiconductor device is conveyed into the reflow furnace by the conveyer, the semiconductor device is heated gradually in the reflow furnace, so that the solder ball starts to melt at above the solder melting point. The solder ball does not melt simultaneously at all of the mounting positions thereof. The solder ball passed through the reflow furnace early reaches the solder melting point early. Thus, the early passed solder ball starts to melt early.

The solder ball thus melted changes in shape while being wetted and spread on the land, and decreases in height. In this case, due to difference in timing when the solder ball starts to melt as mentioned above, difference in height is caused between the solder ball spread over the land and the solder ball not spread over the land yet. For this reason, the semiconductor device inclines to form a slope. According as the inclination of the semiconductor device increases (the inclination being likely accelerated by the own weight of the device depending on the melting timing), positional relationship between the solder ball and the land changes, although they were in even contact with each other before the reflow mounting process. Therefore, distance between a solder ball starting to melt late and the corresponding land becomes greater than that between the solder ball starting to melt early and the corresponding land, so that parallelization degree between the wiring boards deteriorates. This causes a failure in interlayer connection to reduce the reliability of interlayer connection. The more the number of the laminated semiconductor devices increases, the more the failure becomes remarkable because the whole weight is increased.

On the other hand, the device of JP-A-2002-76265 is less likely to cause the problem as raised in JP-A-2003-133519 because the solder ball is less likely to decrease in height even after the solder ball is spread over the land in the reflow mounting process. However, another problem is raised that the manufacturing cost must be increased because the solder ball is formed of a particular ball with a core made from copper or nickel.

SUMMARY OF THE INVENTION

It is an object of the invention to provide a multilayer semiconductor device that is capable of enhancing reliability in interlayer connection.

It is a further object of the invention to provide a method of manufacturing the multilayer semiconductor device that is capable of reducing the manufacturing cost.

(1) According to one aspect of the invention, a multilayer semiconductor device comprises:

plural semiconductor devices, each comprising a circuit board for a ball grid array and a semiconductor chip provided on the board, the semiconductor boards being bonded together by a reflow mounting process to use a solder ball for interlayer connection so as to form a multilayer structure, wherein the plural semiconductor devices each comprise a projection for restricting inclination of the circuit board, and the projection is provided between neighboring two of the circuit boards.

In the above invention (1), the following modifications and changes can be made.

(i) The projection is provided at a carry-in side area relative to a reflow furnace in which the plural semiconductor devices are carried and bonded together so as to form the multilayer structure, and at an opposite carry-in side area that is opposite to the carrying-in side area, and the carry-in side area and the opposite carry-in side area are located at an edge on an upper surface of a lower one of the two neighboring circuit boards.

(ii) The projection comprises a height lower than the solder ball interposed between the two neighboring circuit boards.

(iii) The projection is provided on a chip mount surface of the circuit board, the semiconductor chip being mounted on the chip mount surface.

(iv) The projection is made from an insulating organic material.

(2) According to another aspect of the invention, a method of making a multilayer semiconductor device comprising plural semiconductor devices, each comprising a circuit board for a ball grid array and a semiconductor chip provided on the circuit board, the semiconductor boards being bonded together by a reflow mounting process to use a solder ball for interlayer connection so as to form a multilayer structure, comprises the steps of:

providing an adhesive material for mounting the semiconductor chip on the circuit board;

mounting the semiconductor chip on the circuit board through the unhardened adhesive material and providing a projection for restricting inclination of the circuit board through the unhardened adhesive material between neighboring two of the circuit boards;

hardening the unhardened adhesive material.

In the above invention (2), the following modifications and changes can be made.

(v) A plurality of the projections are formed and attached onto the circuit board simultaneously by punching an insulating film.

ADVANTAGES OF THE INVENTION

The multilayer semiconductor device of the invention is capable of enhancing reliability in interlayer connection.

Also, the method of making the multilayer semiconductor device of the invention is capable of reducing the manufacturing cost.

BRIEF DESCRIPTION OF THE DRAWINGS

The preferred embodiments according to the invention will be explained below referring to the drawings, wherein:

FIG. 1A is a cross sectional view showing a multilayer semiconductor device in a first preferred embodiment according to the invention;

FIG. 1B is a cross sectional view taken along the line A-A in FIG. 1A;

FIG. 1C is a side view showing a multilayer semiconductor device in a first preferred embodiment according to the invention;

FIGS. 5A, 5B and 5C are a cross sectional view respectively showing a multilayer semiconductor device in a second preferred embodiment according to the invention;

DETAILED DESCRIPTION OF THE PREFERRED EMBODIMENTS

First Embodiment

Figure 2:
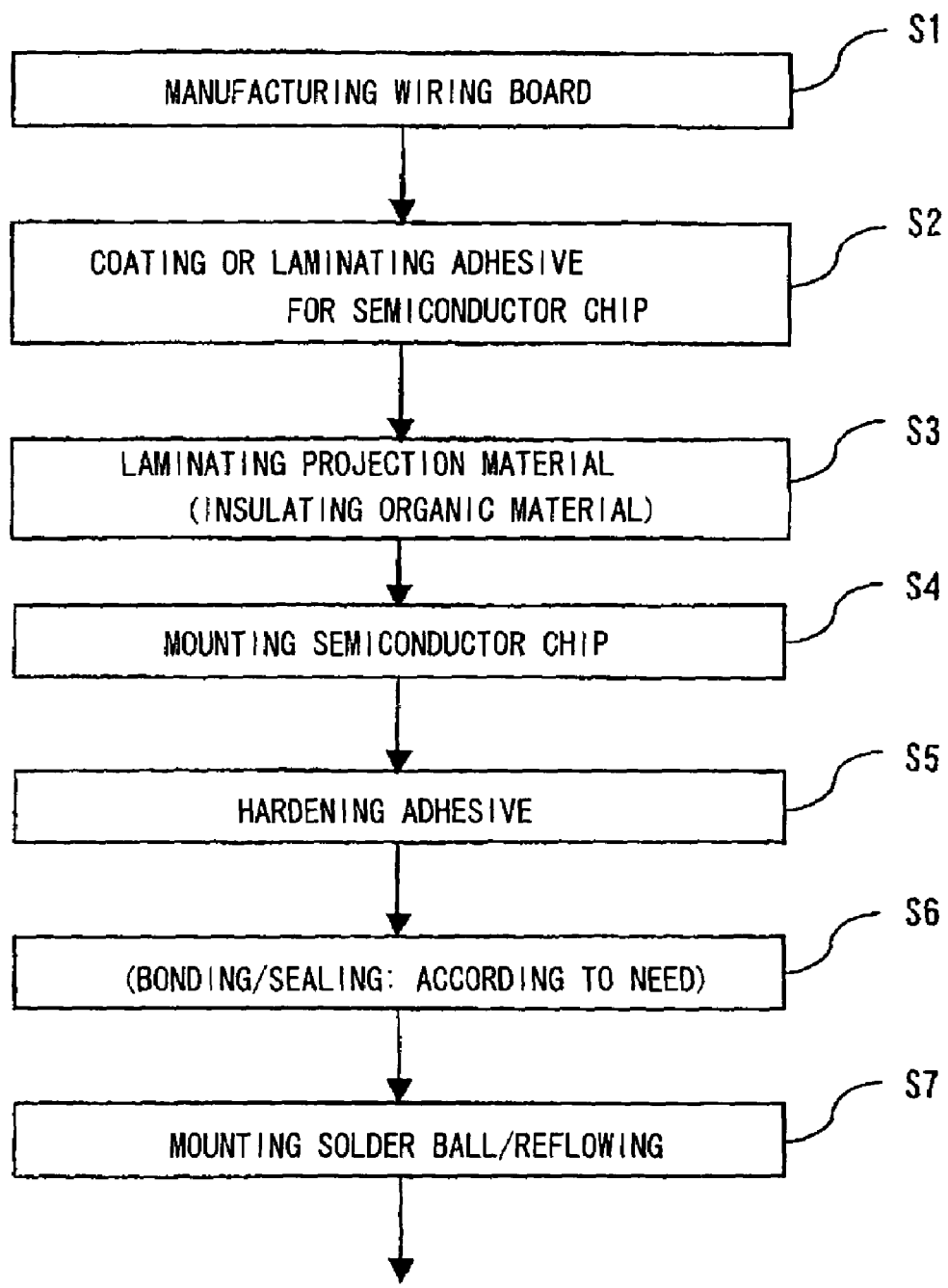
FIG. 2 is a flow chart showing a method of manufacturing a multilayer semiconductor device in a first preferred embodiment according to the invention.

FIG. 1 shows a multilayer semiconductor device in the first preferred embodiment according to the invention. FIG. 1A is a cross sectional view, FIG. 1B is a cross sectional view taken along the line A-A in FIG. 1A, and FIG. 1C is a side view.

Composition of Multilayer Semiconductor Device

As shown in FIGS. 1A to 1C, a multilayer semiconductor device 1 comprises two semiconductor devices 3, 4 being connected together by a reflow mounting process using a solder ball 2 for interlayer connection to form a multilayer structure.

Composition of the Semiconductor Device 3

The semiconductor device 3 comprises a semiconductor chip 5 having a circuit surface 5A on a board side and a circuit board (or wiring board) 6 for BGA on which the semiconductor chip 5 is mounted.

A semiconductor chip 5 is mounted at the central region in width direction of the circuit board 6 through an adhesive film 7 having a nearly planar H-shape. The adhesive film 7 is laminated at the central region in width direction and at both edges of the circuit board 6, on the surface of the circuit board 6 where the semiconductor chip 5 is mounted.

The circuit board 6 has a structure that a predetermined conductor pattern (not shown) is formed on an insulating plate (not shown), and the whole of the board 6 is formed of a rectangle plate. A projection 8 for restricting inclination of the circuit board is laminated at corners (i.e., four corners of the circuit board 6) of both edges (i.e., a carry-in side edge relative to a reflow furnace where the semiconductor devices 3, 4 are carried in and bonded together so as to form the multilayer structure, and an opposite carry-in side edge being opposite to the carry-in side edge) on the upper surface (i.e., the surface where the semiconductor chip 5 is mounted) of the circuit board 6 through the adhesive film 7.

The projection 8 is formed of a hexahedron and is made from a flame-retardant and insulating organic material as a whole. The projection 8 is set to have a height lower than the solder ball 2. Also, the projection 8 is set to be uniform in thickness. The flame-retardant and insulating organic material can be a polyimide film, a crystalline liquid polymer film, and the like. On the surface (i.e., land surface) of the circuit board 6 on which the semiconductor chip 5 is not mounted, a solder ball 9 for external connection is provided. The plural solder balls 9 for external connection (seven balls are shown in FIG. 1) are disposed in parallel at each of both side edges of the circuit board 6 in both side areas of the semiconductor chip 5.

Composition of the Semiconductor Device 4

The semiconductor device 4, similarly to the semiconductor device 3, comprises a semiconductor chip 10 having a circuit surface 10A on a board side and a circuit board (or wiring board) 11 for BGA on which the semiconductor chip 10 is mounted. The semiconductor device 4 is bonded onto the semiconductor device 3.

The semiconductor chip 10 is, similarly to the semiconductor chip 5, provided at the central region in width direction of the circuit board 11 through an adhesive film 12 having a planar rectangle shape.

The circuit board 11 has a structure that a predetermined conductor pattern (not shown) is formed on an insulating plate (not shown), and the whole of the board 11 is formed of a rectangle plate which has the same outer size as the circuit board 6. On an opposite chip mounting surface (i.e., a land surface) of the circuit board 11, the solder balls 2 for interlayer connection are mounted. The plural solder balls 2 (seven balls are shown in FIG. 1) are provided in parallel at each of both side edges of the circuit board 11 in both side areas of the semiconductor chip 10 over the solder balls 9.

Next, a method of manufacturing the multilayer semiconductor device of the first preferred embodiment according to the invention will be explained in conjunction with the appended drawing (FIG. 2). FIG. 2 is a flow chart showing the method of manufacturing the multilayer semiconductor device in the first preferred embodiment according to the invention.

The method of manufacturing the multilayer semiconductor device in the first embodiment includes steps of "laminating of the adhesive film" and "disposing of the projection", "disposing of the semiconductor chip", "hardening of the adhesive film", and "bonding of the semiconductor devices", which will be explained below respectively and sequentially, because these steps are conducted sequentially.

Laminating of the Adhesive Film

The circuit boards 6, 11 are preliminarily prepared by forming a conductor pattern (not shown) on an insulating board (not shown) (STEP S1 in FIG. 2). The adhesive film 7 having a nearly planar H-shape and the adhesive film 12 having a nearly planar rectangular shape are each laminated on the circuit surface side of the circuit boards 6, 11 (STEP S2 in FIG. 2). In this case, the adhesive film 7 is laminated on an area including a chip mounting position (one site) and a projection bonding position (four sites), and the adhesive film 12 is laminated on an area including a chip mounting position (one site). In the above case, although the adhesive films 7, 12 as an adhesive material is laminated on the circuit boards 6, 11, an adhesive agent may be coated on the circuit boards 6, 11 instead of the adhesive films.

Disposing of the Projection

The four projections 8 are disposed at protrusion bonding positions of the circuit board 6 through the adhesive film 7 (STEP S3 in FIG. 2). Then, the projections 8 are bonded simultaneously when being formed by a press mold used for the formation and bonding of the adhesive film 7.

Disposing of the Semiconductor Chip

The semiconductor chips 5, 10 are disposed at the chip mounting position of the circuit boards 6, 11 through the adhesive film 7 (STEP S4 in FIG. 2). Alternatively, the semiconductor chips 5, 10 may be disposed prior to or simultaneously with the disposing of the projection 8.

Hardening of the Adhesive Film

The adhesive films 7, 12 on the circuit board 6, 11 are hardened (STEP S5 in FIG. 2). In this case, when the adhesive films 7, 12 are hardened, the semiconductor chips 5, 10 are mounted respectively on the chip mounting surface side of the circuit boards 6, 11 through the adhesive films 7, 12, and the projection 8 is bonded onto the chip mounting surface side of the circuit boards 6, 11.

Bonding of the Semiconductor Devices

The solder balls 2, 9 are mounted respectively on the opposite chip mounting surface (i.e., land surface) of the circuit boards 6, 11. After the solder balls 2, 9 are mounted, if necessary, a step of sealing the semiconductor chips 5, 10 and a wire-bonding step thereof may be conducted prior to the bonding step of the semiconductor devices (STEP S6 in FIG. 2)

Then, semiconductor devices 3, 4 are laminated together while interposing the solder ball 2 between the circuit boards 6 and 11, and the semiconductor 3 is laminated on a mounting board (not shown) through the solder ball 9 for external connection. In this case, when the semiconductor devices 3, 4 are laminated together, a flux is coated on the surface of the solder balls 2, 9 and the land of the semiconductor device 3 (i.e., mounting board) in order to remove an oxide film thereon and to prevent the semiconductor devices 3, 4 from being displaced from each other when being carried into the reflow by the conveyer furnace.

Then, the semiconductor devices 3, 4 being laminated together are carried into the reflow furnace (not shown), and then the semiconductor devices 3, 4 are taken out from the reflow furnace to harden the solder balls 2, 9. In this case, when the solder balls 2, 9 are hardened, the semiconductor devices 3, 4 are bonded together through the solder ball (STEP Is in FIG. 2) and the semiconductor device 3 is bonded onto the mounting board (not shown) through the solder ball 9. Thus, the multilayer semiconductor device 1 is manufactured.

Next, circuit board-behaviors when the semiconductor devices 3, 4 being laminated are carried into the reflow furnace in the method of manufacturing the multilayer semiconductor device of the embodiment (with the projection) and a conventional multilayer semiconductor device (without the projection), will be explained referring to FIGS. 3A to 4C.

Figure 3A:
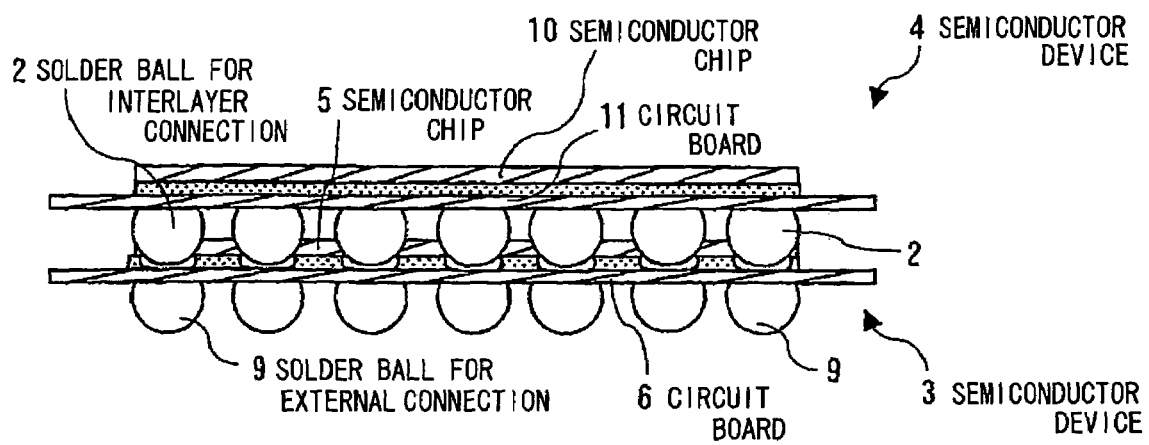
FIGS. 3A and 3B are a cross sectional view respectively showing behavior of a circuit board in a conventional method of manufacturing a multilayer semiconductor device when a semiconductor device is carried into a reflow furnace in laminated condition.
Figure 3B:
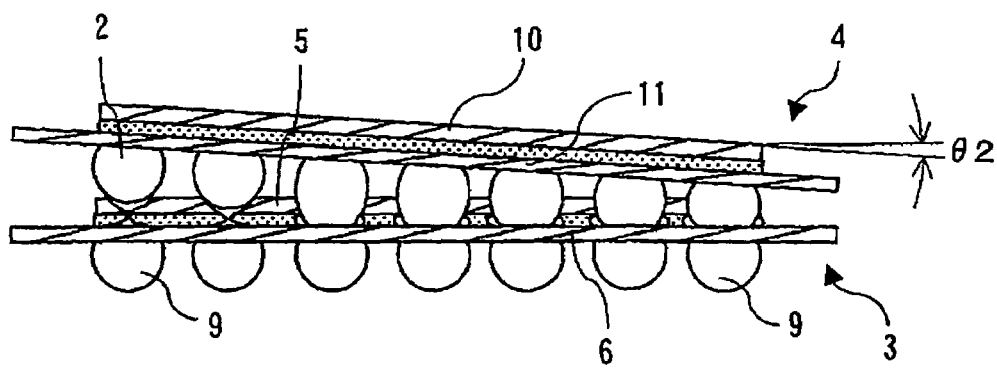
Figure 4A:
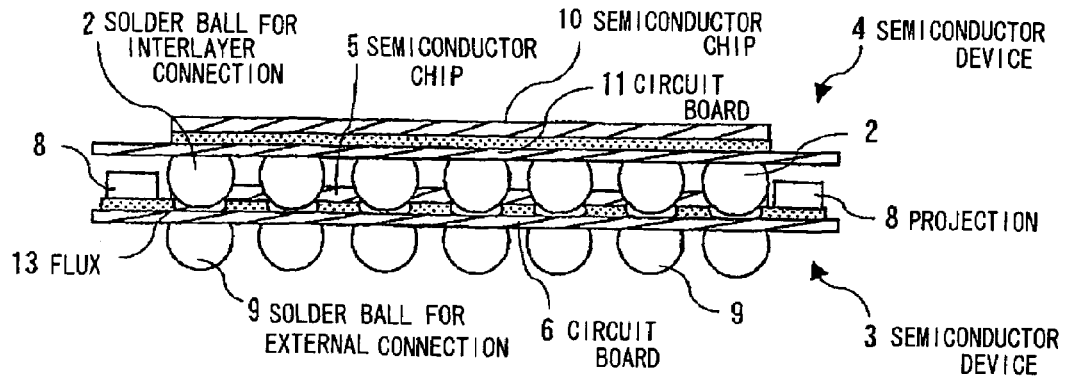
FIGS. 4A, 4B and 4C are a cross sectional view respectively showing behavior of a circuit board in a method of manufacturing a multilayer semiconductor device of a first preferred embodiment according to the invention when a semiconductor device is carried into a reflow furnace in laminated condition.
Figure 4B:
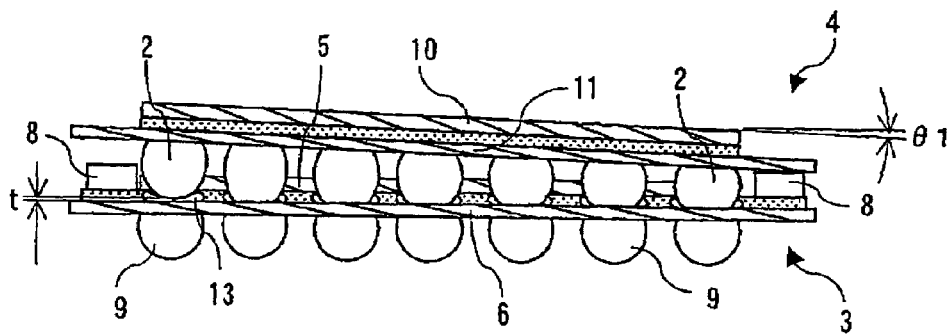
Figure 4C:
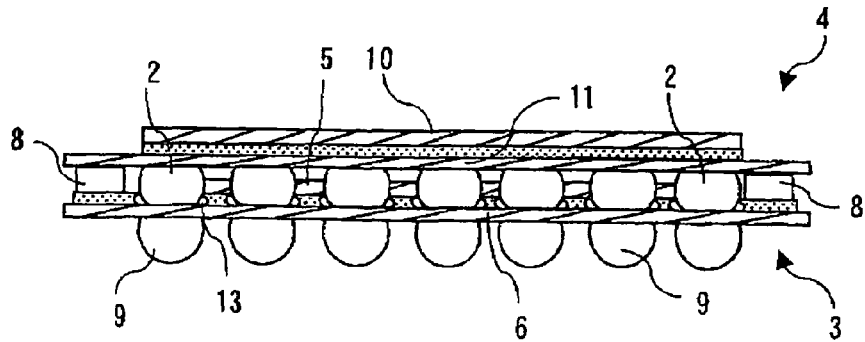

FIGS. 3A and 3B show the circuit board-behavior in the conventional method of manufacturing the multilayer semiconductor device when the semiconductor devices being laminated are carried into the reflow furnace. FIG. 3A is a cross sectional view showing a state before the circuit board is carried into the reflow furnace. FIG. 3B is a cross sectional view showing a state that a part of the circuit board is carried into the reflow furnace. FIGS. 4A to 4C show the circuit board-behavior in the method of manufacturing the multilayer semiconductor device of the first embodiment when the semiconductor devices being laminated are carried into the reflow furnace. FIG. 4A is a cross sectional view showing a state before the circuit board is carried into the reflow furnace. FIG. 4B is a cross sectional view showing a state that a part of the circuit board is carried into the reflow furnace. FIG. 4C is a cross sectional view showing a state after the circuit board is carried into the reflow furnace. In FIGS. 3A and 3B, the same parts as used in FIGS. 4A to 4C are indicated by the same reference numerals, and the detail explanation is omitted.

As shown in FIG. 3A, in the conventional method of manufacturing the multilayer semiconductor device, when the semiconductor devices 3, 4 being laminated together are carried into the reflow furnace, the solder ball 2 on the carry-in side edge (i.e., right side edge in FIG. 3A) of the circuit board 11 becomes lower in height than the solder ball 2 on the opposite carry-in side edge (i.e., left side edge in FIG. 3A) of the circuit board 11 because the former solder ball is melted earlier than the latter solder ball. Therefore, as shown in FIG. 3B, the circuit board 11 inclines with an angle of θ2 relative to the circuit board 6. Thus, the solder ball 2 on the opposite carry-in side edge of the circuit board 11 is away from the land of the circuit board 6 so that a defective interlayer connection is caused.

In contrast, as shown in FIG. 4A, in the method of manufacturing the multilayer semiconductor device in the embodiment, when the semiconductor devices 3, 4 being laminated together are carried into the reflow furnace, similarly to the case of the conventional method, the solder ball 2 on the carry-in side edge of the circuit board 11 becomes lower in height than the solder ball 2 on the opposite carry-in side edge of the circuit board 11 because the former solder ball is melted earlier than the latter solder ball. However, as shown in FIG. 4B, the circuit board 11 inclines with a decreased angle of $\theta 1$ (where $\theta 1<\theta 2$) relative to the circuit board 6 because the carry-in side edge of the circuit board 11 strikes against the projection 8 on the carry-in side edge of the circuit board 6. Thus, the solder ball 2 on the opposite carry-in side edge of the circuit board 11 is not away from the land of the circuit board 6 so that a good interlayer connection is obtained.

In this case, when the flux 13 is coated on the surface of the solder ball 2 and the land of the semiconductor device 3, the semiconductor devices 3, 4 can be laminated together more effectively. For example, when the solder ball 2 of 0.45 mm in diameter is mounted on the land (0.3 mm in diameter) of the circuit board 11, the solder ball 2 becomes about 0.4 mm in height, and when the bonding of the semiconductor devices 3, 4 are conducted normally, the solder ball 2 becomes 0.33 mm in height. Therefore, when the timing when the solder ball 2 starts to melt is different, the solder ball 2 melted early is wetted and spread over the land and becomes about 0.07 mm (=0.4 mm~0.33 mm) lower in height than the solder ball 2 melted late. Thus, the semiconductor device 3 may incline relative to the semiconductor device 4 so that a tip portion of the solder ball 2 melted late is away from the land. However, if the distance of being away from the land is smaller than the height t (t≈0.05 mm) of the flux 13, no defective interlayer connection between the semiconductor devices 3 and 4 is caused since the solder ball 2 is wetted and spread on the land.

Then, the solder ball 2 on the opposite carry-in side edge of the circuit board 6 is melted so that the solder ball 2 on the opposite carry-in side edge has almost the same height as the solder ball 2 on the carry-in side edge as shown in FIG. 4C. Therefore, the semiconductor devices 3, 4 are bonded together such that the circuit boards 6, 11 are in parallel.

In the multilayer semiconductor device 1 of the embodiment, it is preferable that the height (H) of the projection 8 is set to be in the range of: $(h \times 0.8) \leq H \leq h$, where h is the height of the solder ball 2 when the bonding of the semiconductor devices 3, 4 is conducted normally. If the height (H) of the projection 8 is greater than the height (h) of the solder ball 2, the projection 8 will prevent the bonding of the semiconductor devices 3, 4. If the height (H) of the projection 8 is less than 80% of the height (h) of the solder ball 2, the defective connection will be caused between the semiconductor devices 3 and 4.

Advantages of the First Embodiment

The following advantages can be obtained by the first preferred embodiment as explained above.

(1) Even when the solder ball 2 on the carry-in side edge of the circuit board 11 is melted earlier in the reflow mounting process than the solder ball 2 on the opposite carry-in side edge of the circuit board 11, the carry-in side edge of the circuit board 11 strikes against the projection 8 on the carry-in side edge of the circuit board 6 to restrict the semiconductor device 3 from inclining relative to the semiconductor device 4. Therefore, the solder ball 2 on the opposite carry-in side edge of the circuit board 11 is not away from the land of the circuit board 6 so that a good interlayer connection can be conducted. As a result, reliability in interlayer connection can be enhanced.

(2) The solder ball 2 for interlayer connection is not needed to have a specific core made of copper or nickel, so that the multilayer semiconductor device 1 can be manufactured by using a usual solder ball. As a result, the manufacturing cost can be reduced.

(3) The projection 8 is made from an insulating organic material so that it can be superior in workability to a projection made from a metal material, and that it can exclude adverse affect to signal transmission caused by electrostatic induction. Also the projection 8 is made from a flame-retardant material so that it can contribute to the protection of the global environment being an issue of burning concern in recent years.

(4) The plural (four in the embodiment) projections 8 are simultaneously formed and bonded onto the four corners of the circuit board 6 so that the formation and bonding time of the projection 8 can be shortened. In this case, when the formation and bonding time of the projection 8 is conducted by using the same machine as used in the formation and bonding (laminating) of the adhesive film 7, a specific machine to for only the projection 8 becomes unnecessary.

(5) The projection 8 and the semiconductor chip 5 are disposed on the circuit board 6 through unhardened adhesive film 7 and subsequently the unhardened adhesive film 7 is hardened. Therefore, the semiconductor chip 5 can be prevented from suffering thermal and mechanical stress.

(6) The projection 8 can be bonded onto the circuit board 6 by using the adhesive film 7 for chip mounting. Therefore, a specific adhesive film for bonding only the projection 8 becomes unnecessary. As a result, the number of steps for bonding the projection 8 onto the circuit board 6 can be reduced and the bonding of the projection 8 can be easy conducted. Also, since the projection 8 can be bonded onto the circuit board 6 through the adhesive film 7, the amount of material for the projection 8 can be reduced so that the material cost can be reduced.

Second Embodiment

FIGS. 5A to 5C show a multilayer semiconductor device in the second preferred embodiment according to the invention. FIG. 5A is a cross sectional view thereof, FIG. 5B is a cross sectional view taken along the line B-B in FIG. 5A, and FIG. 5C is a side view thereof. In FIGS. 5A and 5B, the same parts as used in FIGS. 1A to 1C are indicated by the same reference numerals, and the detail explanation is omitted.

As shown in FIGS. 5A to 5C, the multilayer semiconductor device 51 is characterized in that the projection 8 is bonded onto the circuit board 6 by a second adhesive film (not shown) which is different from a first adhesive film 52 for mounting of the semiconductor chip 5.

Thus, the projection 8 is bonded onto the circuit board 6 through the second adhesive film that has almost the same planar shape (i.e., rectangle) as the projection 8. Also, the semiconductor chips 5, 10 are sealed by sealing resins 53 and 54, respectively, and are mounted on the circuit boards 6, 11 through the first adhesive film 52.

Advantages of the Second Embodiment

In addition to advantages of a first embodiment (1) to (5), the following advantages can be obtained by the second preferred embodiment as explained above.

Since the first and second adhesive films are formed of a rectangle shape, the processing of the films can be conducted easily.

Other Embodiments

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, the following modifications and alternative constructions can be employed.

Figure 6:
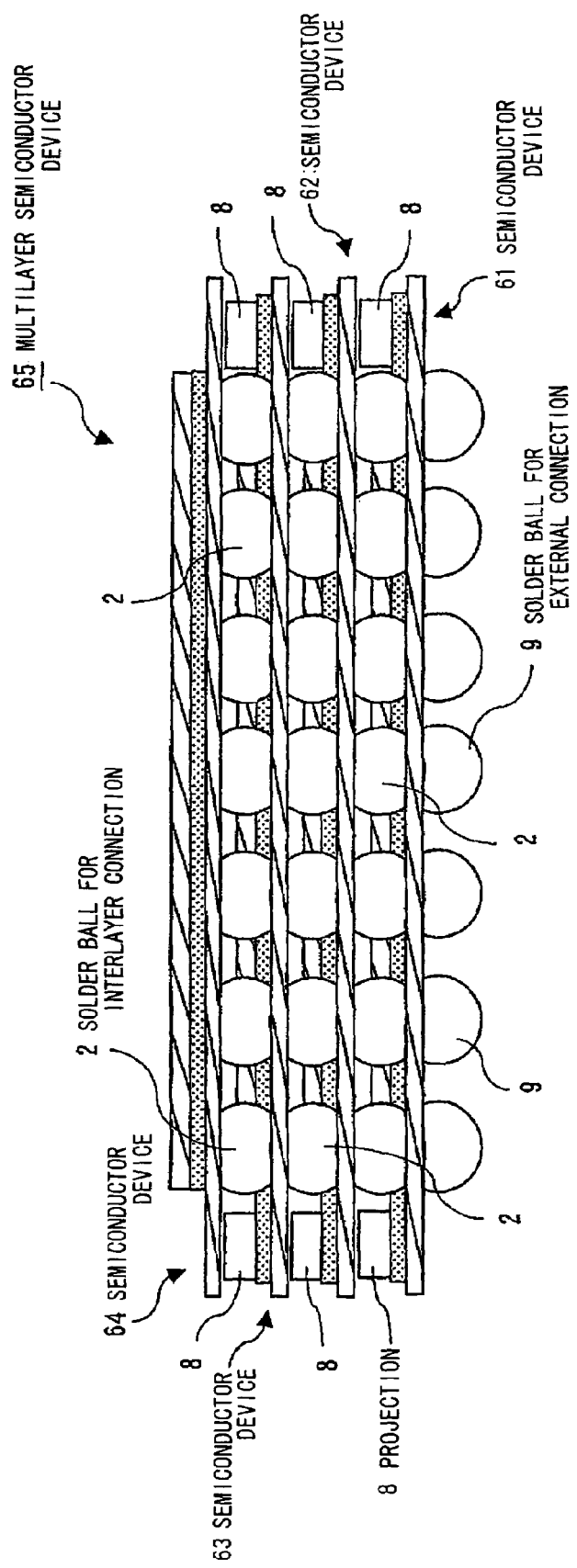
FIG. 6 is a side view showing a modified example (1) of a multilayer semiconductor device in each preferred embodiment according to the invention.

(1) Although the multilayer semiconductor devices in the above embodiments employ the two-layer structure that the semiconductor devices 3, 4 are laminated together, the invention is not limited to such structure. For example, as shown in FIG. 6, a multilayer semiconductor device 65 with a four-layer structure may be applied that semiconductor devices 61 to 64 are laminated together. Also, the multilayer semiconductor device may have a three-layer structure or a five or more-layer structure. Thus, the number of layers can be optionally changed.

Figure 7A:
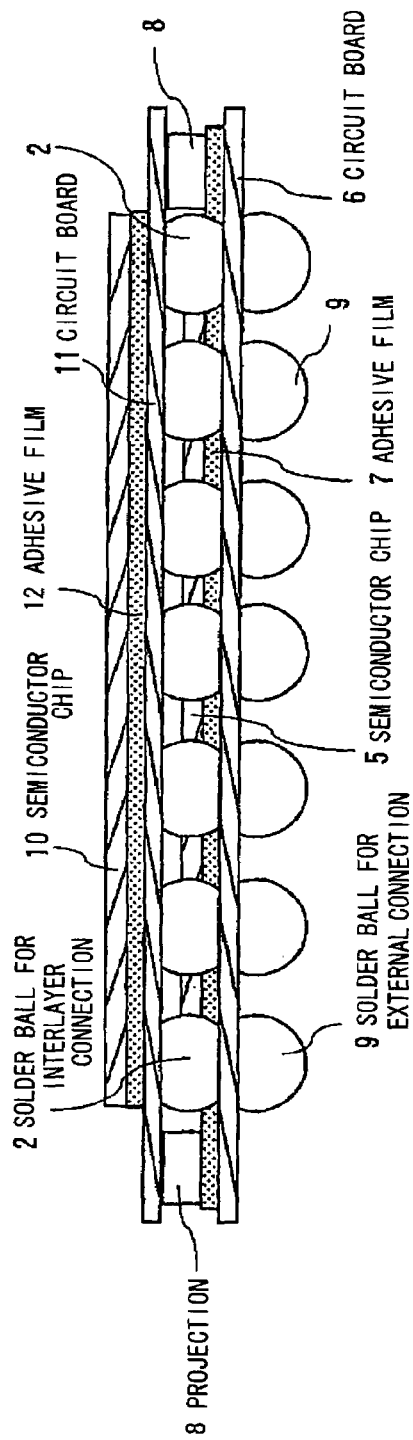
FIGS. 7A and 7B are a side view respectively showing a modified example (2) of a multilayer semiconductor device in each preferred embodiment according to the invention.
Figure 7B:
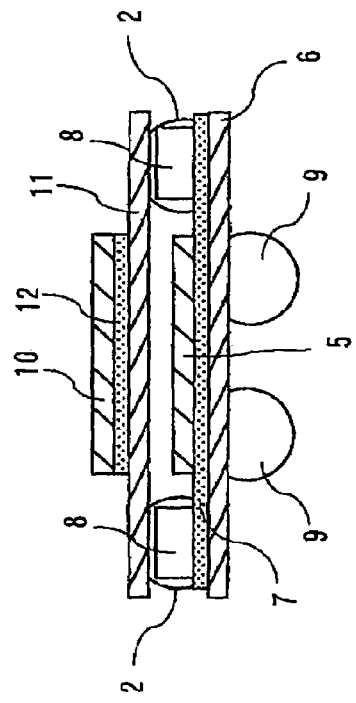

(2) Although the multilayer semiconductor devices in the above embodiments employ the structure that the solder ball 2 for interlayer connection and the solder ball 9 for external connection are disposed in both side areas of the semiconductor chips 5, 10, the invention is not limited to such structure. For example, as shown in FIGS. 7A and 7B, the solder ball 2 for interlayer connection may be disposed in both side areas of the semiconductor chips 5, 10 and the solder ball 9 for external connection may be disposed under the semiconductor chip 5.

(3) Although the multilayer semiconductor devices in the above embodiments employ the structure that the projection 8 is provided at the edges (i.e., four corners) on the chip mounting surface side of the circuit board 6, the invention is not limited to such structure. Namely, the projection 8 may be provided at the edges on the opposite chip mounting surface (which is opposite to the chip mounting surface of the circuit board 6) of the circuit board 11. In short, the projection for restricting the circuit board-inclination in the invention may be provided between neighboring two of plural laminated circuit boards. Also, the number of the projection 8 is not limited unless it causes a defective interlayer connection in the reflow mounting process.

(4) Although the multilayer semiconductor devices in the above embodiments employ the structure that the semiconductor chips 5, 10 are mounted through the adhesive films 7, 12, 52 on the circuit board 6, 11, the invention is not limited to such structure. Alternatively, an underfill may be filled between the semiconductor chip and the circuit board.

What is claimed is:

1. A multilayer semiconductor device, comprising:
   plural semiconductor devices, each comprising a circuit board for a ball grid array and a semiconductor chip provided on the circuit board, bonded through an adhesive on the circuit board, the plural semiconductor devices being bonded together by a reflow mounting process to use a solder ball for interlayer connection so as to form a multilayer structure,
   wherein the plural semiconductor devices each comprise projections for restricting inclination of the circuit board,
   wherein the projections are provided between two neighboring circuit boards, bonded through the adhesive on the circuit board, said projections being provided at a carry-in side area, relative to a reflow furnace in which the plural semiconductor devices are carried and bonded together to form the multilayer structure, and at an opposite carry-in side area that is opposite to the carry-in side area,
   wherein the carry-in side area and the opposite carry-in side area are located at edges on an upper surface of a lower one of the two neighboring circuit boards, the semiconductor chip and the solder ball being mounted on the upper surface, and
   wherein the projections are laminated at corners of both edges on the upper surface of the lower one of the two neighboring circuit boards.

2. The multilayer semiconductor device according to claim 1, wherein each of the projections comprises a height (H) lower than the solder ball interposed between the two neighboring circuit boards.

3. The multilayer semiconductor device according to claim 2, wherein the height (H) of each of the projections is in a range of $(h \times 0.8) \leq H \leq h$, where h is a height of the solder ball.

4. The multilayer semiconductor device according to claim 1, wherein the projections comprise an insulating organic material.

5. The multilayer semiconductor device according to claim 4, wherein the projections are attached onto the lower one of two neighboring circuit boards simultaneously by punching a film of said insulating organic material.

6. The multilayer semiconductor device according to claim 4, wherein said insulating organic material comprises one of a polyimide film and a crystalline liquid polymer film.

7. The multilayer semiconductor device according to claim 1, wherein each of the projections comprises a flame-retardant material.

8. The multilayer semiconductor device according to claim 7, wherein said flame-retardant material comprises one of a polyimide film and a crystalline liquid polymer film.

9. The multilayer semiconductor device according to claim 1, wherein the projections have a uniform thickness.

10. The multilayer semiconductor device according to claim 1, wherein the projections are mounted simultaneously with a mounting of the semiconductor chip.

11. The multilayer semiconductor device according to claim 1, wherein a carry-in side edge of an upper one of the two neighboring circuit boards strikes against one of the projections on the edge of the carry-in side area of the lower one of the two neighboring circuit boards such that the upper one of the two neighboring circuit boards inclines with a decreased angle relative to the lower one of the two neighboring circuit boards.

12. The multilayer semiconductor device according to claim 1, wherein said adhesive comprises an adhesive film having a planar shape similar to a planar shape of the projections.

13. The multilayer semiconductor device according to claim 1, wherein the projections are bonded simultaneously when being formed by a press mold used for a formation and bonding of the adhesive.

14. The multilayer semiconductor device according to claim 1, wherein the adhesive for attaching the semiconductor chip and the adhesive for attaching the projections comprise a common adhesive film.

15. The multilayer semiconductor device according to claim 1, wherein the semiconductor chip and the projections are provided through the adhesive on a same side of the board.

16. The multilayer semiconductor device according to claim 1, wherein said semiconductor chip has a rectangular shape, and
 wherein said semiconductor chip is sandwiched on outer edges of longer sides of said rectangular shape by said projections and said ball grid array.

17. A multilayer semiconductor device, comprising:
 plural semiconductor devices, each comprising a circuit board for a ball grid array and a semiconductor chip provided on the circuit board, bonded through an adhesive on the circuit board, the plural semiconductor devices being bonded together by a reflow mounting process to use a solder ball for interlayer connection so as to form a multilayer structure,
 wherein the plural semiconductor devices each comprise projections for restricting inclination of the circuit board,
 wherein the projections are provided between two neighboring circuit boards, bonded through the adhesive on the circuit board, said projections provided at edges on an opposite chip mounting surface of an upper one of said two neighboring circuit boards, said opposite chip mounting surface opposite to a chip mounting surface of a lower one of said two neighboring circuit boards, and
 wherein said projections are laminated at corners of edges on the opposite chip mounting surface of the upper one of the two neighboring circuit boards.

18. The multilayer semiconductor device according to claim 17, wherein each of the projections comprises a flame-retardant material.

* * * * *